United States Patent
Lee et al.

(10) Patent No.: US 9,466,810 B2
(45) Date of Patent: Oct. 11, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Jae-Yong Lee, Yongin (KR); Yang-Wan Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/450,369

(22) Filed: Aug. 4, 2014

(65) Prior Publication Data
US 2015/0041791 A1  Feb. 12, 2015

(30) Foreign Application Priority Data
Aug. 8, 2013 (KR) ........................ 10-2013-0094305

(51) Int. Cl.
  *H01L 51/52* (2006.01)
  *H01L 51/56* (2006.01)
  *H01L 27/32* (2006.01)

(52) U.S. Cl.
  CPC ........ *H01L 51/5253* (2013.01); *H01L 27/3276* (2013.01); *H01L 51/56* (2013.01); *H01L 27/3246* (2013.01); *H01L 27/3279* (2013.01); *H01L 51/5228* (2013.01)

(58) Field of Classification Search
None
See application file for complete search history.

(56) References Cited

U.S. PATENT DOCUMENTS

| 2005/0029937 A1 | 2/2005 | Kim |
| 2005/0057151 A1* | 3/2005 | Kuwabara ............. H05B 33/22 313/506 |
| 2005/0184927 A1* | 8/2005 | Kwak ................ H01L 51/5237 345/45 |

(Continued)

FOREIGN PATENT DOCUMENTS

| EP | 1575090 A2 | 9/2005 |
| KR | 1020060048373 | 5/2006 |

(Continued)

OTHER PUBLICATIONS

European Search Report dated Feb. 17, 2015 for Application No. 14180162.1.

*Primary Examiner* — Erik Kielin
(74) *Attorney, Agent, or Firm* — F. Chau & Associates, LLC

(57) ABSTRACT

An organic light emitting diode (OLED) display includes a substrate including a pixel area and a surrounding peripheral area. The pixel area includes at least one pixel including an organic light emitting element. The OLED display includes a common voltage line disposed in the peripheral area and configured to transmit a common voltage to the pixel area, a barrier rib disposed on the substrate and covering one side of the common voltage line, a protection member covering another side of the common voltage line, at least one thin film transistor (TFT) disposed in the pixel area, a first electrode disposed in the pixel area and connected to the at least one TFT, an organic emission layer disposed on the first electrode, a second electrode disposed on the organic emission layer and connected to the common voltage line, and an encapsulation layer disposed on the protection member and the second electrode.

16 Claims, 4 Drawing Sheets

(56) References Cited

U.S. PATENT DOCUMENTS

| | | | |
|---|---|---|---|
| 2007/0063936 A1* | 3/2007 | Jung et al. | 345/76 |
| 2007/0146246 A1 | 6/2007 | Nakamura et al. | |
| 2009/0115321 A1* | 5/2009 | Hayashi | 313/504 |
| 2011/0043495 A1* | 2/2011 | Bang | H01L 27/3276 345/204 |
| 2012/0146030 A1* | 6/2012 | You | H01L 27/124 257/59 |
| 2012/0205678 A1* | 8/2012 | Ikeda et al. | 257/88 |
| 2013/0049003 A1* | 2/2013 | Choi | H01L 51/5246 257/72 |
| 2014/0042408 A1* | 2/2014 | Akagawa et al. | 257/40 |
| 2014/0353666 A1* | 12/2014 | Lee et al. | 257/59 |

FOREIGN PATENT DOCUMENTS

| | | |
|---|---|---|
| KR | 1020110019498 | 2/2011 |
| KR | 1020120069560 | 6/2012 |

* cited by examiner

ORGANIC LIGHT EMITTING DIODE DISPLAY

CROSS-REFERENCE TO RELATED APPLICATIONS

This application claims priority under 35 U.S.C. §119 to Korean Patent Application No. 10-2013-0094305 filed on Aug. 8, 2013, the disclosure of which is incorporated by reference herein in its entirety.

TECHNICAL FIELD

Exemplary embodiments of the present invention relate to an organic light emitting diode (OLED) display.

DISCUSSION OF THE RELATED ART

An organic light emitting diode (OLED) display includes two electrodes and an organic emission layer interposed therebetween. Electrons injected from a cathode that is one electrode, and holes injected from an anode that is another electrode, are bonded to each other in the organic emission layer to form excitons, and light is emitted while the excitons discharge energy.

Each pixel of the organic light emitting diode display may include a switching thin film transistor, a driving thin film transistor, a capacitor, and an organic light emitting diode. A driving voltage is supplied from a driving voltage line to the driving thin film transistor and the capacitor, and the driving thin film transistor serves to control the current flowing to the organic light emitting diode through the driving voltage line.

A common voltage line supplies a common voltage to the cathode and forms a potential difference between a pixel electrode as an anode and a common electrode, thereby causing a current to flow between the pixel electrode and the common electrode.

The anode may be formed on an entire pixel unit of the substrate, and to prevent a voltage drop, a signal may be transmitted from a common voltage line formed near the pixel unit.

The pixel unit and the common voltage line may be protected by an encapsulation member. However, the common voltage line may be exposed to different etching processes before forming the encapsulation member, and as a result, a side wall of the exposed common voltage line may be etched or damaged. This damage may form a crack in the encapsulation member when forming the encapsulation member on the common voltage line, and as a result, moisture permeation and an out-gassing function may be deteriorated.

SUMMARY

Exemplary embodiments of the present invention provide an organic light emitting diode (OLED) display capable of preventing moisture permeation and an out-gassing function from being deteriorated due to damage to a common voltage line.

According to an exemplary embodiment of the present invention, an organic light emitting diode (OLED) display includes a substrate including a pixel unit including an organic light emitting element displaying an image and a periphery enclosing the pixel unit, a common voltage line positioned at the periphery of the substrate and transmitting a common voltage from the outside, a barrier rib positioned on the substrate and covering one side of the common voltage line, a protection member covering the other side of the common voltage line, a plurality of thin film transistors positioned at the pixel unit, a first electrode positioned at the pixel unit and respectively connected to the thin film transistor, an organic emission layer positioned on the first electrode, a second electrode positioned on the organic emission layer and electrically connected to the common voltage line, and an encapsulation layer disposed on the protection member and the second electrode.

A connection member contacting the common voltage line between the barrier rib and the protection member may be further included.

The second electrode may contact the connection member to be connected thereto.

The connection member may be formed of the same material as the second electrode.

The protection member may cover one side of the connection member positioned on the common voltage line.

The protection member may be formed of the same material as the barrier rib.

An interlayer insulating layer positioned between the thin film transistor and the first electrode may be further included, and the interlayer insulating layer may be formed of the same material as the protection member.

The common voltage line may enclose the pixel unit, and the protection member may be formed according to the common voltage line.

The encapsulation layer may include at least one of an inorganic layer and an organic layer.

According to an exemplary embodiment of the present invention, an organic light emitting diode (OLED) display includes a substrate including a pixel unit including an organic light emitting element displaying an image and a periphery enclosing the pixel unit, a common voltage line positioned at the periphery of the substrate and transmitting a common voltage from the outside, a plurality of thin film transistors positioned at the pixel unit, a first electrode positioned at the pixel unit and respectively connected to the thin film transistor, a barrier rib positioned on the substrate and having a first opening exposing the first electrode and a second opening exposing the common voltage line, an organic emission layer positioned on the first electrode, a second electrode positioned on the organic emission layer and connected to the common voltage line through the second opening, and an encapsulation layer disposed on the protection member and the second electrode. A boundary of the second opening is positioned within a boundary of the common voltage line.

A connection member contacting the common voltage line through the second opening to be connected thereto may be further included, and the second electrode may contact the connection member to be connected thereto.

The connection member may be formed of the same material as the second electrode.

A protection member covering one side of the connection member positioned on the common voltage line may be further included.

The protection member may be formed of the same material as the barrier rib.

The common voltage line may enclose the pixel unit, and the protection member may be formed according to the common voltage line.

The encapsulation layer may include at least one of an inorganic layer and an organic layer.

According to an exemplary embodiment of the present invention, an organic light emitting diode (OLED) display includes a substrate including a pixel area and a peripheral area surrounding the pixel area. The pixel area includes at least one pixel including an organic light emitting element. The OLED display further includes a common voltage line disposed in the peripheral area and configured to transmit a common voltage to the pixel area, a barrier rib disposed on the substrate and covering one side of the common voltage line, a protection member covering another side of the common voltage line, at least one thin film transistor disposed in the pixel area, a first electrode disposed in the pixel area and connected to the at least one thin film transistor, an organic emission layer disposed on the first electrode, and a second electrode disposed on the organic emission layer and connected to the common voltage line.

According to an exemplary embodiment of the present invention, an organic light emitting diode (OLED) display includes a substrate including a pixel area and a peripheral area surrounding the pixel area, wherein the pixel area includes at least one pixel including an organic light emitting element, a common voltage line disposed in the peripheral area and configured to transmit a common voltage to the pixel area, at least one thin film transistor disposed in the pixel area, a first electrode disposed in the pixel area and connected to the at least one thin film transistor, a barrier rib disposed on the substrate and including a first opening exposing the first electrode and a second opening exposing the common voltage line, an organic emission layer disposed on the first electrode, and a second electrode disposed on the organic emission layer and connected to the common voltage line through the second opening. A boundary of the second opening is positioned within a boundary of the common voltage line.

According to an exemplary embodiment of the present invention, an organic light emitting diode (OLED) display includes a substrate including a pixel area and a peripheral area surrounding the pixel area, wherein the pixel area includes at least one pixel including an organic light emitting element, a common voltage line disposed in the peripheral area and configured to transmit a common voltage to the pixel area, a protection member disposed on the substrate in the peripheral area and covering a side of the common voltage line, a first electrode disposed in the pixel area, an organic emission layer disposed on the first electrode, a second electrode disposed on the organic emission layer in the pixel area, and connected to the common voltage line in the peripheral area, and a connection member disposed in the peripheral area between the common voltage line and the second electrode. The second electrode contacts the connection member and is connected to the common voltage line via the connection member.

In the organic light emitting diode (OLED) display according to exemplary embodiments of the present invention, damage to the side wall of the common voltage line may be prevented or reduced, resulting in an organic light emitting diode (OLED) display with improved moisture permeation resistance and out-gassing functions.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
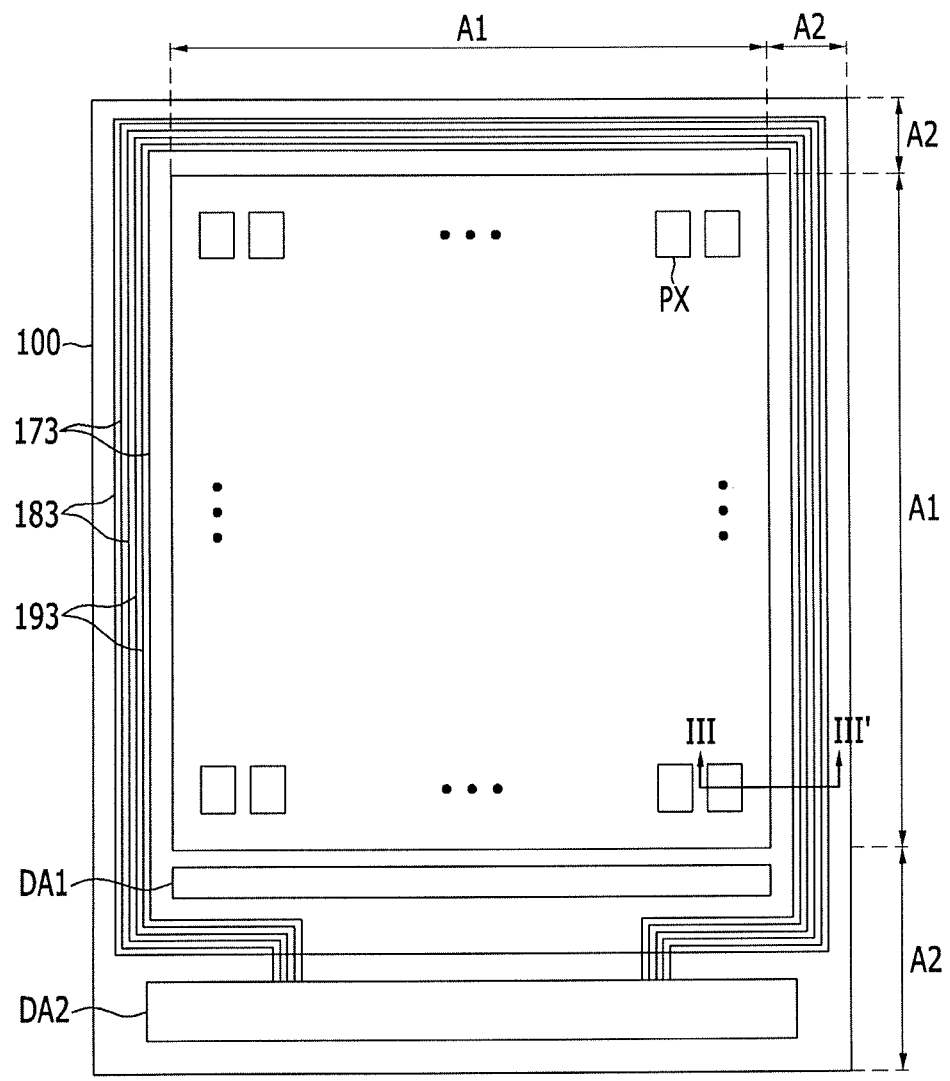
FIG. 1 is a plan view of an organic light emitting diode (OLED) display, according to an exemplary embodiment of the present invention.

Exemplary embodiments of the present invention will be described more fully hereinafter with reference to the accompanying drawings. Like reference numerals may refer to like elements throughout the accompanying drawings.

In the drawings, the size and thickness of layers, films, panels, regions, etc., may be exaggerated for clarity. It will be understood that when an element such as a layer, film, region, or substrate is referred to as being "on", "between", "connected to", "coupled to", or "adjacent to" another element, it can be directly on, between, connected to, coupled to, or adjacent to the other element, or one or more intervening elements may also be present.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

FIG. 1 is a plan view of an organic light emitting diode (OLED) display, according to an exemplary embodiment of the present invention.

As shown in FIG. 1, an organic light emitting diode (OLED) display according to an exemplary embodiment includes a substrate 100, a pixel area A1 formed on the substrate 100 in which a plurality of pixels PX, each including an organic light emitting element, are formed, and a peripheral area A2 enclosing/surrounding the pixel area A1. That is, the peripheral area A2 is adjacent to the pixel area A1 on all sides of the pixel area A1, thereby surrounding the pixel area A1. Thus, referring to FIG. 1, the pixel area A1 includes the area including the plurality of pixels PX, and the remaining area surrounding the pixel area A1 on all sides includes the peripheral area A2 (e.g., the peripheral area A2 is not limited to the areas adjacent to the upper and lower portions of the pixel area A1, but rather, includes the areas adjacent to the upper, lower, left and right portions of the pixel area A1, thereby enclosing the pixel area A1). A pixel PX of the pixel area A1 will be described in detail with reference to FIG. 2.

Figure 2:
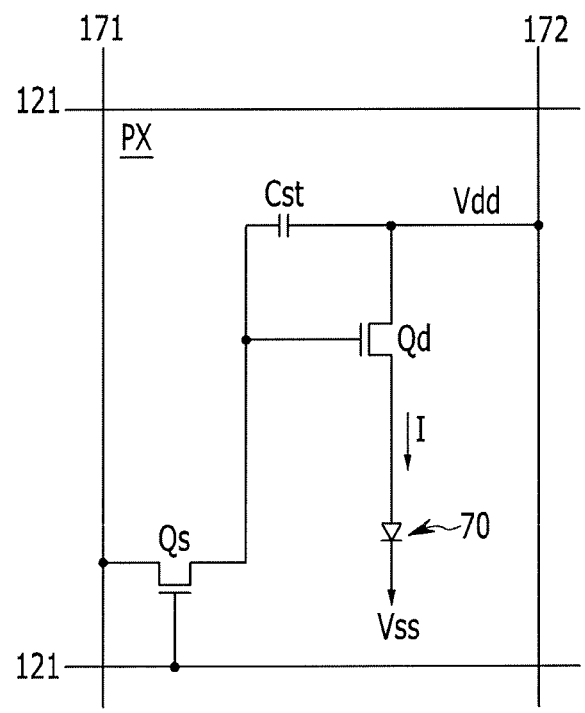
FIG. 2 is an equivalent circuit for one pixel of an organic light emitting diode (OLED) display, according to an exemplary embodiment of the present invention.

FIG. 2 is an equivalent circuit for one pixel of an organic light emitting diode (OLED) display, according to an exemplary embodiment of the present invention.

Figure 3:
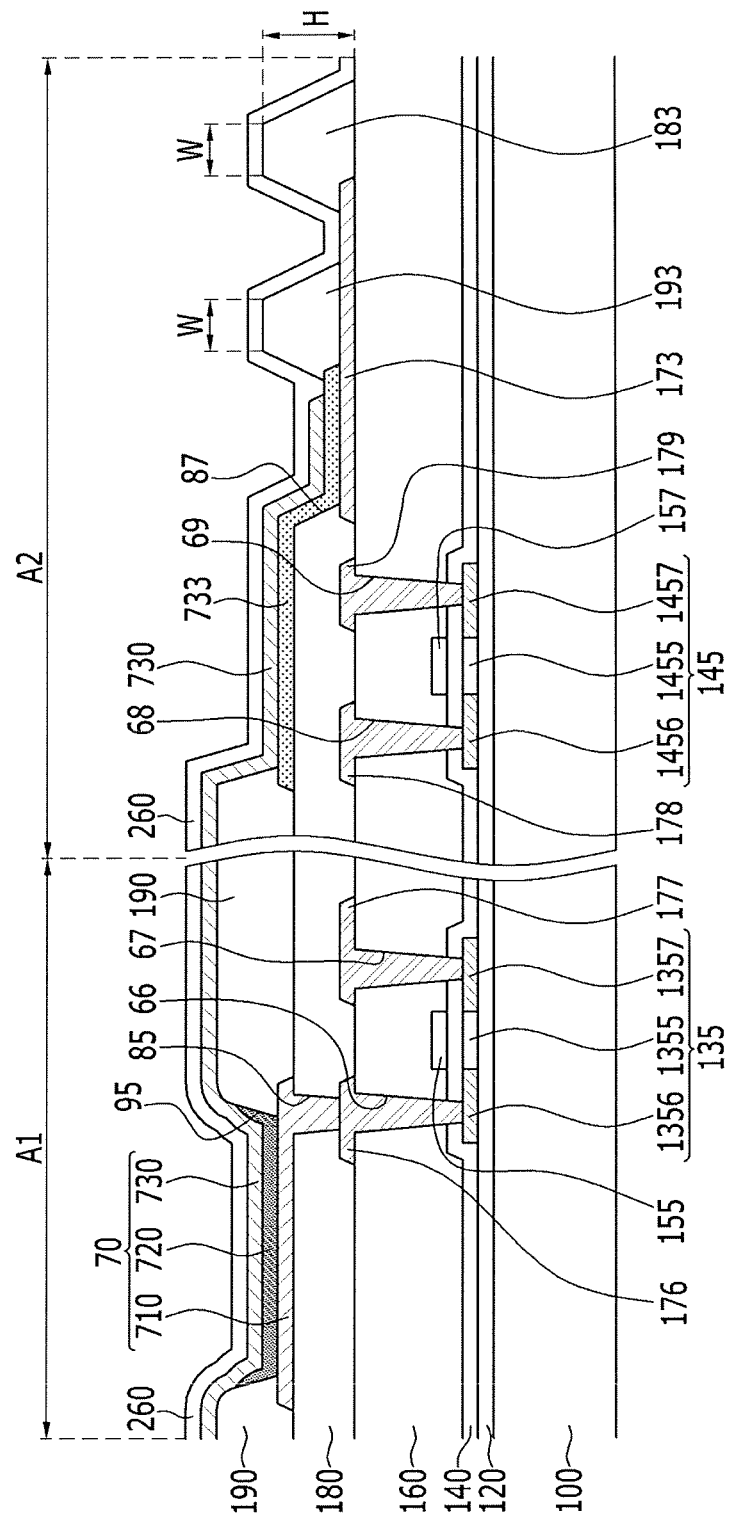
FIG. 3 is a cross-sectional view taken along line of FIG. 1, according to an exemplary embodiment of the present invention.

It is to be understood that exemplary embodiments are not limited to the structure of one pixel of the display panel as shown in FIGS. 2 and 3. A wire and an organic light emitting element can be configured in various manners. For example, although FIG. 2 shows a 2-transistor, 1-capacitor (2T1C)

active matrix (AM) type of display device having two thin film transistors (TFTs) and one capacitor for each pixel, exemplary embodiments are not limited thereto. That is, according to exemplary embodiments, the display device is not limited to a certain number of thin film transistors, capacitors, and wires. The pixel represents a unit for displaying the image, and the display device uses a plurality of pixels to display the image.

Referring to FIG. 2, a display device according to an exemplary embodiment includes a plurality of signal lines 121, 171, and 172, and a plurality of pixels PX connected thereto. For example, the plurality of pixels PX may be substantially arranged in a matrix.

The signal lines include a plurality of gate signal lines 121 that transmit gate signals (scanning signals), a plurality of data lines 171 that transmit data signals, and a plurality of driving voltage lines 172 that transmit a driving voltage Vdd. The gate lines 121 extend substantially in a first direction (e.g., row direction), and are parallel, or substantially parallel to each other. The data lines 171 and the driving voltage lines 172 extend substantially in a second direction (e.g., column direction), and are parallel, or substantially parallel to each other. The first direction and the second direction cross each other.

Each pixel PX includes a switching thin film transistor Qs, a driving thin film transistor Qd, a storage capacitor Cst, and an organic light emitting element (e.g., an organic light emitting diode (OLED)) 70.

The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs responds to the scan signal applied to the gate line 121 and transfers the data signal applied to the data line 171 to the driving thin film transistor Qd.

The driving thin film transistor Qd includes a control terminal, an input terminal, and an output terminal. The control terminal is connected to the switching thin film transistor Qs, the input terminal is connected to the driving voltage line 172, and the output terminal is connected to the organic light emitting element 70. The driving thin film transistor Qd allows an output current I, which has a magnitude that varies according to a voltage applied between the control terminal and the output terminal, to flow.

The storage capacitor Cst is connected between the control terminal and the input terminal of the driving thin film transistor Qd. The storage capacitor Cst charges the data signal applied to the control terminal of the driving thin film transistor Qd, and maintains the data signal after the switching thin film transistor Qs is turned off.

The organic light emitting element 70 includes an anode connected to the output terminal of the driving thin film transistor Qd, and a cathode connected to a common voltage Vss. The organic light emitting element 70 emits light having an intensity depending on the output current I of the driving switching transistor Qd, thereby displaying images.

Referring to the peripheral area A2 of FIG. 1, a built-in circuit unit DA1, in which a driving circuit that drives the pixel PX, is formed. In addition, a mounting driver DA2, in which a common voltage line 173 connected to the second electrode of the organic light emitting element 70, is formed. The mounting driver DA2 applies a signal to the common voltage line 173. As described above, the peripheral area A2 is not limited to the area adjacent to the lower portion of the pixel area A1 that includes the built-in circuit unit DA1 and the mounting driver DA2, but rather, includes the areas adjacent to the upper, lower, left and right portions of the pixel area A1, thereby enclosing the pixel area A1.

The built-in circuit unit DA1 refers to a region in which a driving circuit that drives the pixels, such as, for example, a scan driver and a light emission control driver, is formed. The built-in circuit unit DA1 may further include a test circuit.

As shown in FIG. 1, the built-in circuit unit DA1 may be positioned at one side of the pixel area A1, however, the location of the built-in circuit unit DA1 is not limited thereto. For example, in an exemplary embodiment, the built-in circuit unit DA1 may be positioned at both sides of the pixel area A1.

A common voltage line 173 is connected to the second electrode of the pixel area A1 such that the second electrode maintains a uniform potential. The common voltage line 173 may be formed at one side or both sides of the pixel area A1, and may enclose the pixel area A1.

The mounting driver DA2 may be mounted and embodied as an IC chip including a data driver. The mounting driver DA2 may be mounted on a rigid substrate or be attached on an additive flexible film (e.g., COF (chip-on-film)).

An inter-layer structure of an organic light emitting diode (OLED) display, according to an exemplary embodiment of the present invention, will be described with reference to FIGS. 3 and 4.

FIG. 3 is a cross-sectional view taken along line of FIG. 1, according to an exemplary embodiment of the present invention. FIG. 4 is a cross-sectional view of an organic light emitting diode (OLED) display, according to an exemplary embodiment of the present invention. For convenience of explanation, the description of elements described with reference to FIG. 3 may be omitted with reference to FIG. 4, and only differences between FIGS. 3 and 4 may be described herein.

FIG. 3 illustrates a pixel PX according to a layer formation order focusing on the driving thin film transistor Qd and the organic light emitting element 70 of FIG. 1. The built-in circuit unit DA1 of the peripheral area A2 may include a thin film transistor having various shapes and sizes according to the circuit, and it is to be understood that exemplary embodiments are not limited to the thin film transistor as described herein.

Hereinafter, the driving thin film transistor Qd positioned at the pixel area A1 may be referred to as a pixel thin film transistor, and the thin film transistor of the built-in circuit unit DA1 positioned at the peripheral area A2 may be referred to as a peripheral thin film transistor.

As shown in FIG. 3, the organic light emitting diode (OLED) display includes a substrate 100. A buffer layer 120 may be formed on the substrate 100.

According to exemplary embodiments, the substrate 100 may be a transparent insulating substrate made of, for example, glass, quartz, ceramic, or plastic, or a metal substrate made of, for example, stainless steel. The substrate 100 may be formed of a plastic material having excellent heat resistance and durability such as polyethylene ether phthalate, polyethylene naphthalene, polycarbonate, polyarylate, polyetherimide, polyether sulfone, and polyimide.

The buffer layer 120 may be a single layer buffer layer or a multi-layer buffer layer. For example, the buffer layer 120 may be formed of a single layer of a silicon nitride (SiNx), or a multi-layer in which a silicon nitride (SiNx) and a silicon oxide ($SiO_x$) are deposited. The buffer layer 120 may prevent impurities or moisture from infiltrating the substrate 100, and may planarize the surface of the substrate 100.

Semiconductor layers 135 and 145 may be formed on the buffer layer 120 and may be formed of, for example, polysilicon.

The semiconductor layers 135 and 145 are respectively divided into channel regions 1355 and 1455, and source regions 1356 and 1456 and drain regions 1357 and 1457 may be formed on respective sides of the channel regions 1355 and 1455. One of the drain regions 1357 and 1457 may be connected to the drain electrode 177, and one of the source regions 1356 and 1456 may be connected to the source electrode 176. The source electrode 176 may be connected to the first electrode 710 (anode of the organic light emitting element 70). The channel regions 1355 and 1455 may be made of, for example, undoped polysilicon (e.g., an intrinsic semiconductor). The channel, source and drain regions may be formed by a doping process.

The source regions 1356 and 1456 and the drain regions 1357 and 1457 may be made of, for example, polysilicon doped with a conductive impurity (e.g., an impurity semiconductor).

The impurity doped into the source regions 1356 and 1456 and the drain regions 1357 and 1457 may be, for example, a p-type impurity or an n-type impurity.

A gate insulating layer 140 is formed on the semiconductor layers 135 and 145. The gate insulating layer 140 may be a single layer or a multi-layer. The gate insulating layer 140 may include tetraethyl orthosilicate (TEOS), a silicon nitride, or a silicon oxide.

Gate electrodes 155 and 157 are formed on the gate insulating layer 140 and the gate electrodes 155 and 157 respectively overlap the channel regions 1355 and 1455.

The gate electrodes 155 and 157 may be formed of a single layer or multiple layers of a low resistance material or a highly corrosion-resistant material such as, for example, Al, Ti, Mo, Cu, Ni, and alloys thereof.

A first interlayer insulating layer 160 is formed on the gate electrodes 155 and 157.

Similar to the gate insulating layer 140, the first interlayer insulating layer 160 may be formed of a single layer or multiple layers including at least one of tetraethyl orthosilicate (TEOS), a silicon nitride, and a silicon oxide.

The first interlayer insulating layer 160 and the gate insulating layer 140 include source contact holes 66 and 68 and drain contact holes 67 and 69, which respectively expose the source regions 1356 and 1456 and the drain regions 1357 and 1457.

Source electrodes 176 and 178 and drain electrodes 177 and 179, and a common voltage line 173 are formed on the first interlayer insulating layer 160.

The source electrodes 176 and 178 and the drain electrodes 177 and 179 are respectively connected to the source regions 1356 and 1456 and the drain regions 1357 and 1457 through the contact holes 66, 68, 67, and 69.

The drain electrodes 177 and 179 may be made of single or multiple layers of a low resistance material or a highly corrosion-resistant material such as, for example, Al, Ti, Mo, Cu, Ni, and alloys thereof. For example, the drain electrodes 177 and 179 may be formed of three-level layers of Ti/Cu/Ti, Ti/Ag/Ti, Ti/Al/Ti, or Mo/Al/Mo.

The gate electrode 155, the source electrode 176, and the drain electrode 177 function as the control electrode, the input electrode, and the output electrode of FIG. 2 and form the pixel thin film transistor along the semiconductor layer 135. The gate electrode 157, the source electrode 178 and drain electrode 179 form the peripheral thin film transistor along with the semiconductor layer 145.

The channel 1355 and 1455 of the thin film transistor is respectively formed at the semiconductor layers 135 and 145 between the source electrodes 176 and 178 and the drain electrodes 177 and 179.

A second interlayer insulating layer 180 and a first protection member 183 (see FIG. 1) are formed on the source electrodes 176 and 178 and the drain electrodes 177 and 179.

Similar to the first interlayer insulating layer 160, the second interlayer insulating layer 180 may be formed of a single layer or multiple layers of at least one of tetraethyl orthosilicate (TEOS), a silicon nitride, and a silicon oxide. The second interlayer insulating layer 180 may be formed of a low dielectric constant organic material.

The second interlayer insulating layer 180 includes a contact hole 85 exposing the source electrode 176.

An end of the second interlayer insulating layer 180 is positioned on the common voltage line 173, thereby covering one side of the common voltage line 173.

The first protection member 183 encloses the pixel unit according to the common voltage line 173 and overlaps the common voltage line 173 thereby covering the other side of the common voltage line 173. The first protection member 183 may be formed with the same material as the second interlayer insulating layer 180.

The first protection member 183 forms an second opening 87 exposing the common voltage line 173 when forming the contact hole 85 after forming the second interlayer insulating layer 180, thereby forming the first protection member 183 separated from the second interlayer insulating layer 180.

A first electrode 710 and a connection member 733 are formed on the second interlayer insulating layer 180.

The first electrode 710 may be an anode of the organic light emitting element 70 of FIG. 2. In an exemplary embodiment, the second interlayer insulating layer 180 is formed between the first electrode 710 and the drain electrode 177. In an exemplary embodiment, the first electrode 710 may be formed of the same material as the drain electrode 177, and may be integrally formed with the drain electrode 177.

The connection member 733 contacts the common voltage line 173 exposed through the second opening 87, and is electrically connected thereto.

A barrier rib 190 is formed on the first electrode 710, and a second protection member 193 is formed on the common voltage line 173.

The barrier rib 190 includes a first opening 95 exposing the first electrode 710 to define a pixel. The barrier rib 190 may include a polyacrylate or polyimide resin and a silica-based inorganic material.

The second protection member 193 covers and protects one side of the connection member 733 overlapping the common voltage line 173.

Figure 4:
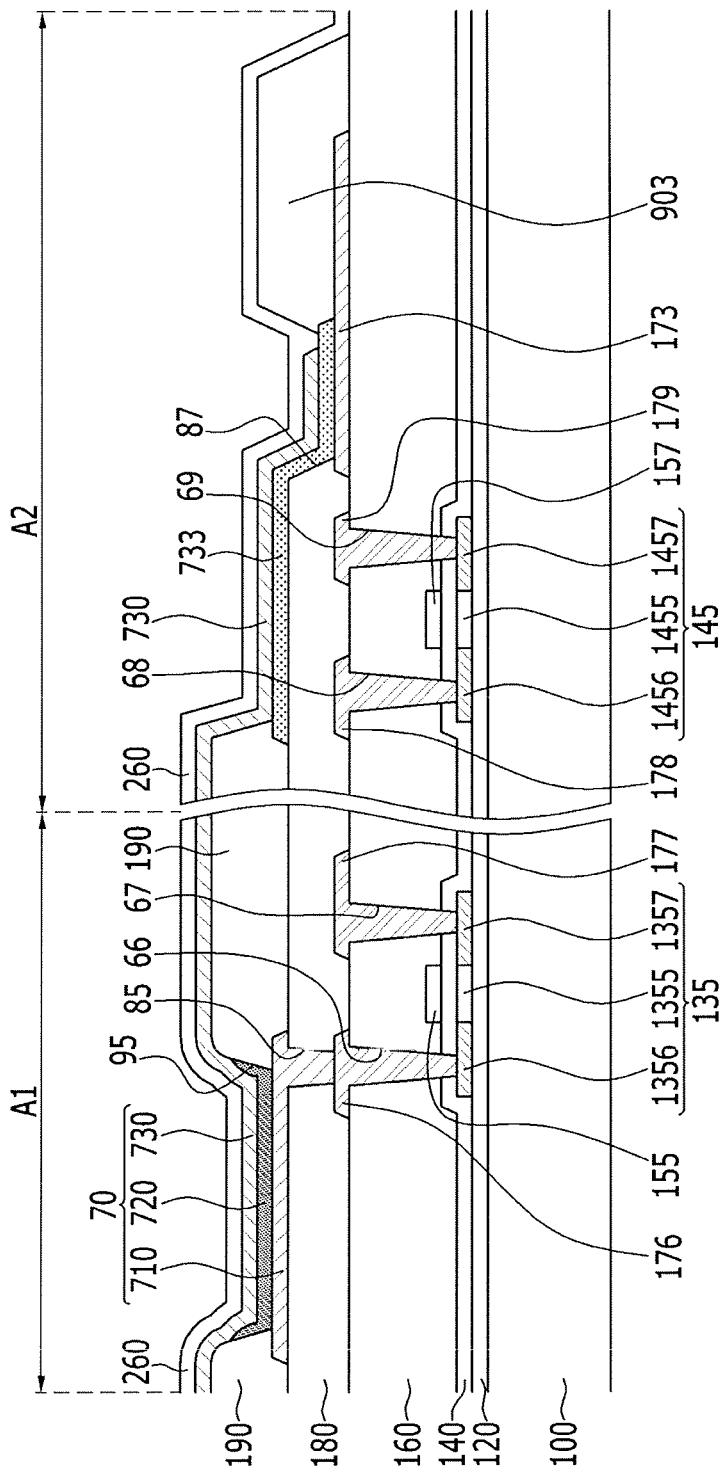
FIG. 4 is a cross-sectional view of an organic light emitting diode (OLED) display, according to an exemplary embodiment of the present invention.

The first and second protection members 183 and 193 (or a single protection member 903 as shown in FIG. 4) may cover one side of the common voltage line 173, and the barrier rib 190 may cover the connection member 733 overlapping the common voltage line 173.

A space between the first protection member 183 and the second protection member 193 may be more than about 10 µm. When the space between the first protection member 183 and the second protection member 193 is narrow, an overlying layer such as the encapsulation layer may not be formed between the first protection member 183 and the second protection member 193.

In exemplary embodiments, the first protection member 183 may be formed along with the second interlayer insulating layer 180, or separately formed from the second interlayer insulating layer 180, and the first protection member 183 may be formed with the same material as the second protection member 193.

That is, in an exemplary embodiment, when forming the barrier rib 190, the first protection member 183 and the second protection member 193 may be formed together. In an exemplary embodiment, the first and second protection members 183 and 193 may form the barrier rib 190.

When the first protection member 183 and the second protection member 193 are formed with the barrier rib 190 at the same time, the first protection member 183 and the second protection member 193 may be formed as one protection member 903 as shown in the exemplary embodiment of FIG. 4. That is, the exemplary embodiment of FIG. 3 may include first and second protection members 183 and 193, and the exemplary embodiment of FIG. 4 may include one protection member 903. When the first and second protection members 183 and 193 form the barrier rib 190, the barrier rib 190 may be described as including a first opening 95 exposing the first electrode 710, and the second interlayer insulating layer 180 and the first protection member 183 may form a second opening 87 exposing the common voltage line 173. As shown in FIGS. 3 and 4, a boundary of the second opening 87 may be positioned within a boundary of the common voltage line 173. That is, the second interlayer insulating layer 180 may overlap a side of the common voltage line 173.

A thickness H of the first protection member 183 may be greater than a thickness of the common voltage line 173. As a result, the first protection member 183 may completely cover a side wall of the common voltage line 173. The thickness H of the first protection member 183 may be less than about 1.5 μm, and a width W of the first protection member 183 may be in a range from about 10 μm to about 30 μm. Referring to FIG. 3, an organic emission layer 720 may be formed in the first opening 95 of the barrier rib 190. The thickness H and width W of the first and second protection members 183 and 193 may be the same, or substantially the same. The thickness H of the first protection member 183 may be greater than the thickness of the second protection member 193.

The organic emission layer 720 may include multiple layers including an emission layer and one or more of a hole injection layer (HIL), a hole transport layer (HTL), an electron transport layer (ETL), and an electron injection layer (EIL).

When the organic emission layer 720 includes all of the above layers, the hole injection layer may be disposed on the first electrode 710 corresponding to the anode, and the hole transport layer, the emission layer, the electron transport layer, and the electron injection layer may be sequentially formed on the hole injection layer.

A second electrode 730 may be formed on the connection member 733, the barrier rib 190, and the organic emission layer 720.

The second electrode 730 may be a cathode of the organic light emitting element 70. Accordingly, the first electrode 710, the organic emission layer 720, and the second electrode 730 form the organic light emitting element 70.

The organic light emitting element 70 may be of one of a front type display, a rear type display, and a dual-sided type display according to the direction in which the organic light-emitting element 70 emits light. According to the type of the display, type of electrodes may be changed.

In the case of the front type display, the first electrode 710 may be formed of a reflective layer and the second electrode 730 may be formed of a transflective or transmissive layer. In the case of the rear type display, the first electrode 710 may be formed of a transflective or transmissive layer and the second electrode 730 may be formed of a reflective layer. In the case of the dual-sided type display, the first electrode 710 and the second electrode 730 may be formed of a transparent layer or a semi-transparent layer.

The reflective layer and the semi-transparent layer include at least one of Mg, Ag, Au, Ca, Li, Cr, and Al, or an alloy thereof. The reflective layer and the transflective layer are determined by the thicknesses thereof, and the transflective layer may have a thickness of less than about 200 nm. While the transmittance of the reflective layer or transflective layer may increase as the thickness thereof decreases, the resistance thereof may increase when the layer is excessively thin.

The transmissive layer is made of indium tin oxide (ITO), indium zinc oxide (IZO), zinc oxide (ZnO), or indium oxide ($In_2O_3$).

The second electrode 730 is connected to the common voltage line 173 via the connection member 733, thereby receiving the signal. Accordingly, a voltage drop of the second electrode 730 may be prevented.

An encapsulation layer 260 is formed on the second electrode 730. The encapsulation layer 260 may be formed by alternately forming at least one organic layer and at least one inorganic layer. A plurality of organic layers or a plurality of inorganic layers may be formed.

The organic layer is formed of a polymer, and may be a single layer or multiple layers including one of polyethylene terephthalate, a polyimide, a polycarbonate, an epoxy, polyethylene, and a polyacrylate. Further, the organic layer may be formed with a polyacrylate, and may include a polymerized monomer composition including a diacrylate monomer and triacrylate monomer. A monoacrylate monomer may be included in the monomer composition. A photoinitiator such as TPO may be further included in the monomer composition, however, exemplary embodiments are not limited thereto.

The inorganic layer may be a single layer or a deposition layer including a metal oxide or a metal nitride. The inorganic layer may include, for example, one of $SiN_x$, $Al2O3$, $SiO2$, and $TiO2$.

The externally exposed uppermost layer of the encapsulation layer 260 may be formed with an inorganic layer. As a result, permeation of vapor into the organic light emitting element may be reduced or prevented.

The encapsulation layer 260 may include at least one sandwich configuration in which at least one organic layer is disposed between at least two inorganic layers, or in which at least one inorganic layer is disposed between at least two organic layers.

The encapsulation layer 260 may sequentially include a first inorganic layer, a first organic layer, and a second inorganic layer disposed in order from top to bottom of the OLED display. In addition, the encapsulation layer 260 may sequentially include a first inorganic layer, a first organic layer, a second inorganic layer, a second organic layer, and a third inorganic layer disposed in order from top to bottom of the OLED display. Further, the encapsulation layer 260 may sequentially include a first inorganic layer, a first organic layer, a second inorganic layer, a second organic layer, a third inorganic layer, a third organic layer, and a fourth inorganic layer disposed in order from top to bottom of the OLED display.

A metal halide layer including LiF may be included between an upper portion of the OLED display and the first inorganic layer. The metal halide layer may prevent the OLED display from being damaged when the first inorganic layer is formed using, for example, a sputtering method or a plasma deposition method.

The first organic layer may be narrower than the first inorganic layer, and the second organic layer may be narrower than the second inorganic layer. Further, the first organic layer may be covered (e.g., entirely covered) by the first inorganic layer, and the second organic layer may be covered (e.g., entirely covered) by the second inorganic layer.

According to exemplary embodiments, the side wall of the common voltage line 173 may be prevented from being exposed by the first protection member 183, and a disconnection of the encapsulation layer 260 by the side wall of the common voltage line 173 may be prevented.

For example, if the side wall of the common voltage line 173 is exposed, the side wall may be damaged during a following process. However, in exemplary embodiments of the present invention, the side wall is protected by the first protection member 183 so that damage may be prevented during a following process. Further, in a case in which the common voltage line 173 is formed of a plurality of layers, when patterning the common voltage line 173, an undercut may be generated by an etching difference. The overlying layer may not be formed according to the side wall of the common voltage line 173 and may be disconnected by this undercut. However, in exemplary embodiments of the present invention, although an undercut may be generated, the first protection member 183 may cover the undercut such that a side wall having a substantially smooth inclination is formed. Accordingly, the overlying layer, such as, for example, the encapsulation layer 260, may be formed according to the layout of the side wall without a disconnection occurring.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An organic light emitting diode (OLED) display, comprising:
    a substrate comprising a pixel area and a peripheral area surrounding the pixel area, wherein the pixel area comprises at least one pixel comprising an organic light emitting element;
    a common voltage line disposed in the peripheral area and configured to transmit a common voltage to the pixel area;
    a barrier rib disposed on the substrate;
    a protection member directly contacting and covering a first portion of the common voltage line and a third portion of the common voltage line, wherein the first portion of the common voltage line comprises a first part of a top surface of the common voltage line, and the third portion of the common voltage line comprises a side surface and a second part of the top surface of the common voltage;
    a connection member contacting the common voltage line between the barrier rib and the protection member, wherein a first portion of the connection member covers a second portion of the common voltage line, the barrier rib covers a second portion of the connection member, and the barrier rib and the protection member do not overlap each other;
    at least one thin film transistor disposed in the pixel area;
    a first electrode disposed in the pixel area and connected to the at least one thin film transistor;
    an organic emission layer disposed on the first electrode;
    a second electrode disposed on the organic emission layer and connected to the common voltage line, wherein a portion of the second electrode and the barrier rib overlap each other, and the second electrode and the protection member do not overlap each other; and
    an encapsulation layer disposed on the protection member and the second electrode,
    wherein the encapsulation layer directly contacts and covers a fourth portion of the common voltage line disposed between the first and third portions of the common voltage line.

2. The organic light emitting diode (OLED) display of claim 1, wherein the encapsulation layer comprises at least one of an inorganic layer and an organic layer.

3. The organic light emitting diode (OLED) display of claim 1, wherein the second electrode contacts and is connected to the connection member.

4. The organic light emitting diode (OLED) display of claim 3, wherein the connection member and the second electrode are formed of a same material.

5. The organic light emitting diode (OLED) display of claim 3, wherein the protection member covers a side of the connection member disposed on the common voltage line.

6. The organic light emitting diode (OLED) display of claim 5, wherein the protection member and the barrier rib are formed of a same material.

7. The organic light emitting diode (OLED) display of claim 1, further comprising:
    an interlayer insulating layer disposed between the at least one thin film transistor and the first electrode,
    wherein the interlayer insulating layer and the protection member are formed of a same material.

8. The organic light emitting diode (OLED) display of claim 1, wherein the common voltage line surrounds the pixel area, and the protection member is formed according to a layout of the common voltage line.

9. An organic light emitting diode (OLED) display, comprising:
    a substrate comprising a pixel area and a peripheral area surrounding the pixel area, wherein the pixel area comprises at least one pixel comprising an organic light emitting element;
    a common voltage line disposed in the peripheral area and configured to transmit a common voltage to the pixel area;
    a protection member disposed on the substrate in the peripheral area and directly contacting and covering a first portion of the common voltage line and a second portion of the common voltage line, wherein the first portion of the common voltage line comprises a first part of a top surface of the common voltage line, and the second portion of the common voltage line comprises a side surface and a second part of the top surface of the common voltage;
    a first electrode disposed in the pixel area;
    an organic emission layer disposed on the first electrode;
    a second electrode disposed on the organic emission layer in the pixel area, and connected to the common voltage line in the peripheral area, wherein the second electrode and the protection member do not overlap each other;

a connection member disposed in the peripheral area between the common voltage line and the second electrode; and an encapsulation layer disposed on the protection member and the second electrode, wherein the second electrode contacts the connection member and is connected to the common voltage line via the connection member, wherein the connection member and the protection member contact the common voltage line, and the encapsulation layer directly contacts and covers a third portion of the common voltage line disposed between the first and second portions of the common voltage line.

10. An organic light emitting diode (OLED) display, comprising:

a substrate comprising a pixel area and a peripheral area surrounding the pixel area, wherein the pixel area comprises at least one pixel comprising an organic light emitting element;

a common voltage line disposed in the peripheral area and configured to transmit a common voltage to the pixel area;

at least one thin film transistor disposed in the pixel area;

a first electrode disposed in the pixel area and connected to the at least one thin film transistor;

a barrier rib disposed on the substrate and comprising a first opening exposing the first electrode;

a protection member disposed on the substrate and comprising a second opening exposing the common voltage line, wherein the protection member directly contacts and covers a first portion of the common voltage line and a second portion of the common voltage line, wherein the first portion of the common voltage line comprises a first part of a top surface of the common voltage line, and the second portion of the common voltage line comprises a side surface and a second part of the top surface of the common voltage;

an organic emission layer disposed on the first electrode, wherein the organic emission layer does not overlap an upper surface of the barrier rib;

a second electrode disposed on the organic emission layer and connected to the common voltage line through the second opening, wherein a portion of the second electrode and the barrier rib overlap each other, and the second electrode and the protection member do not overlap each other; and an encapsulation layer disposed on the protection member and the second electrode, wherein a boundary of the second opening is positioned within a boundary of the common voltage line, and the encapsulation layer directly contacts and covers a third portion of the common voltage line disposed between the first and second portions of the common voltage line.

11. The organic light emitting diode (OLED) display of claim 10, further comprising:

a connection member contacting the common voltage line and connected to the common voltage line through the second opening, wherein the second electrode contacts the connection member.

12. The organic light emitting diode (OLED) display of claim 11, wherein the connection member and the second electrode are formed of a first same material.

13. The organic light emitting diode (OLED) display of claim 12, wherein the protection member covers a side of the connection member disposed on the common voltage line.

14. The organic light emitting diode (OLED) display of claim 13, wherein the protection member and the barrier rib are formed of a second same material.

15. The organic light emitting diode (OLED) display of claim 10, wherein the common voltage line surrounds the pixel area, and the protection member is formed according to a layout of the common voltage line.

16. The organic light emitting diode (OLED) display of claim 10, wherein the encapsulation layer comprises at least one of an inorganic layer and an organic layer.

* * * * *